United States Patent [19]

Cederlind

[11] Patent Number: 5,508,655
[45] Date of Patent: Apr. 16, 1996

[54] CONDITION RESPONSIVE SOLID-STATE SWITCH

[75] Inventor: Gregory F. Cederlind, Woodinville, Wash.

[73] Assignee: Eldec Corporation, Lynnwood, Wash.

[21] Appl. No.: 288,628

[22] Filed: Aug. 10, 1994

[51] Int. Cl.[6] .............................. G05F 1/10; H01L 35/00; H03K 17/14; F23N 5/20
[52] U.S. Cl. .......................... 327/535; 327/537; 327/509; 327/513; 327/427; 327/378; 236/46 R
[58] Field of Search ...................................... 327/512, 513, 327/516, 310, 311, 530, 535, 538, 540, 509, 427, 541, 537, 378; 236/46 R; 237/80

[56] References Cited

U.S. PATENT DOCUMENTS

4,722,475 2/1988 Newell, III et al. ................... 236/46 R
5,240,179 8/1993 Drinkwater ................................ 237/80

*Primary Examiner*—David C. Nelms
*Assistant Examiner*—Trong Phan
*Attorney, Agent, or Firm*—Christensen, O'Connor, Johnson & Kindness

[57] ABSTRACT

Pulse techniques are used to periodically monitor a desired environmental condition, such as pressure. A solid-state switch is connected between a power source and a load. In the off state of the switch, power from the source drives a timer circuit which supplies a short voltage pulse to a circuit for sensing the environmental condition. At the same time, the pulse is supplied to associated circuitry for temperature compensation, amplification of the resulting sensing circuit signal, and a comparator circuit which determines whether or not a signal of the condition sensed exceeds a predetermined threshold. If such signal exceeds the threshold, the solid-state switch is turned on to connect the voltage source to the load. Turning on the switch results in substantially eliminating the voltage drop between the switch terminals, which previously was used to actuate the timer. Accordingly, a separate timer circuit is provided to periodically open the closed power switch for again evaluating the sensed condition and, if appropriate, turn the power switch off.

7 Claims, 13 Drawing Sheets

Fig. 1.

(PRIOR ART)

CONDITION RESPONSIVE SOLID-STATE SWITCH

FIELD OF THE INVENTION

The present invention relates to a solid-state switch that responds automatically to change in an environmental condition to which the switch is subjected, and particularly to such a switch which will emulate operation of a mechanical switch for retrofit into existing installations or circuit designs.

BACKGROUND OF THE INVENTION

There are known mechanical switches that respond to changes in the switch environment, in fact such condition responsive mechanical switches are in wide use. An example is a pressure responsive switch, and a representative application is a pressure responsive switch associated with an aircraft turbine engine. For maximum fuel efficiency, the flow of coolant may be adjusted based on absolute pressure, such as by a solenoid valve controlled by a pressure responsive mechanical switch. Mechanical pressure switches can directly switch electrical leads using only two wires by being connected in series between a power source and the load. Improvements have been made to increase the useful life of mechanical switches, such as the use of sealed contacts. Nevertheless, contact fretting, wear, fatigue, and arcing in harsh environments have continued to be problems. In addition, in the case of a short circuit in the line closed by the switch, no effective current limit is provided.

Solid-state switches have no wearout or cycle life within the rated usage. However, for a system built or designed for use of a mechanical switch, substitution of a solid-state switch may not be possible without extensive redesign. In some fields such redesign can greatly increase the expense, such as in the aircraft industry where significant redesign of circuitry associated with an aircraft engine may require recertification. Such redesign could involve adding a third wire from airframe power to provide a continuous power supply current path for the electronic circuit of the solid-state switch. By comparison, mechanical switches typically require no external power.

Alternatively, the solid-state switch could be designed to have a continuous voltage drop across the switch sufficient to operate its own electronic circuitry. Nevertheless, the voltage drop would subtract from the supply voltage and thereby cause operational problems at low-voltage conditions. In addition, the several volt drop across the switch required to operate its internal circuitry, combined with a large load current, could result in several watts of power dissipation, which further complicates the situation because of excessive switch heating. In an aircraft turbine engine environment, heat already may be a problem given the extreme temperatures to which the switch is subjected.

SUMMARY OF THE INVENTION

The present invention provides an automatic condition responsive solid-state switch that emulates a mechanical switch by requiring only two-wire electrical connection, i.e., connection between a power source and a load, and which does not require additional external power, and which does not significantly affect power supply to the load. In the preferred embodiment, the switch in accordance with the present invention is responsive to changes in absolute pressure and operates reliably with predetermined hysteresis over a wide temperature range and for a wide range of supplied voltage.

The switch in accordance with the present invention uses pulse techniques for periodically monitoring the desired condition, such as pressure. In the off state, power from the source drives a timer circuit which supplies a short voltage pulse to the condition sensing circuitry, and to associated circuitry for temperature compensation, amplification of the resulting pressure signal, and a comparator circuit which determines whether or not the pressure indicated by the amplified pressure signal exceeds a predetermined pressure threshold. If the sensed pressure is greater than the predetermined pressure, a power switch (power transistor) is turned on to connect the voltage source to the load. Turning on or closing the power switch results in substantially eliminating the voltage drop between the switch terminals, which previously was used to actuate the timer circuit. Accordingly, a separate timer circuit is provided to periodically open the closed power switch for again evaluating the sensed condition and, if appropriate, turning the power switch off.

Associated circuitry controls the circuit hysteresis to prevent undesirable chattering when the pressure stays close to the threshold pressure. Predetermined limits are established such that the power switch remains in its on or off state for a range of pressures which depend on whether the switch previously was open or closed. The switch also can include circuitry for limiting the maximum current conveyed through the switch and for providing a trickle current bypassing the switch when it is open for a standard circuit integrity check.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
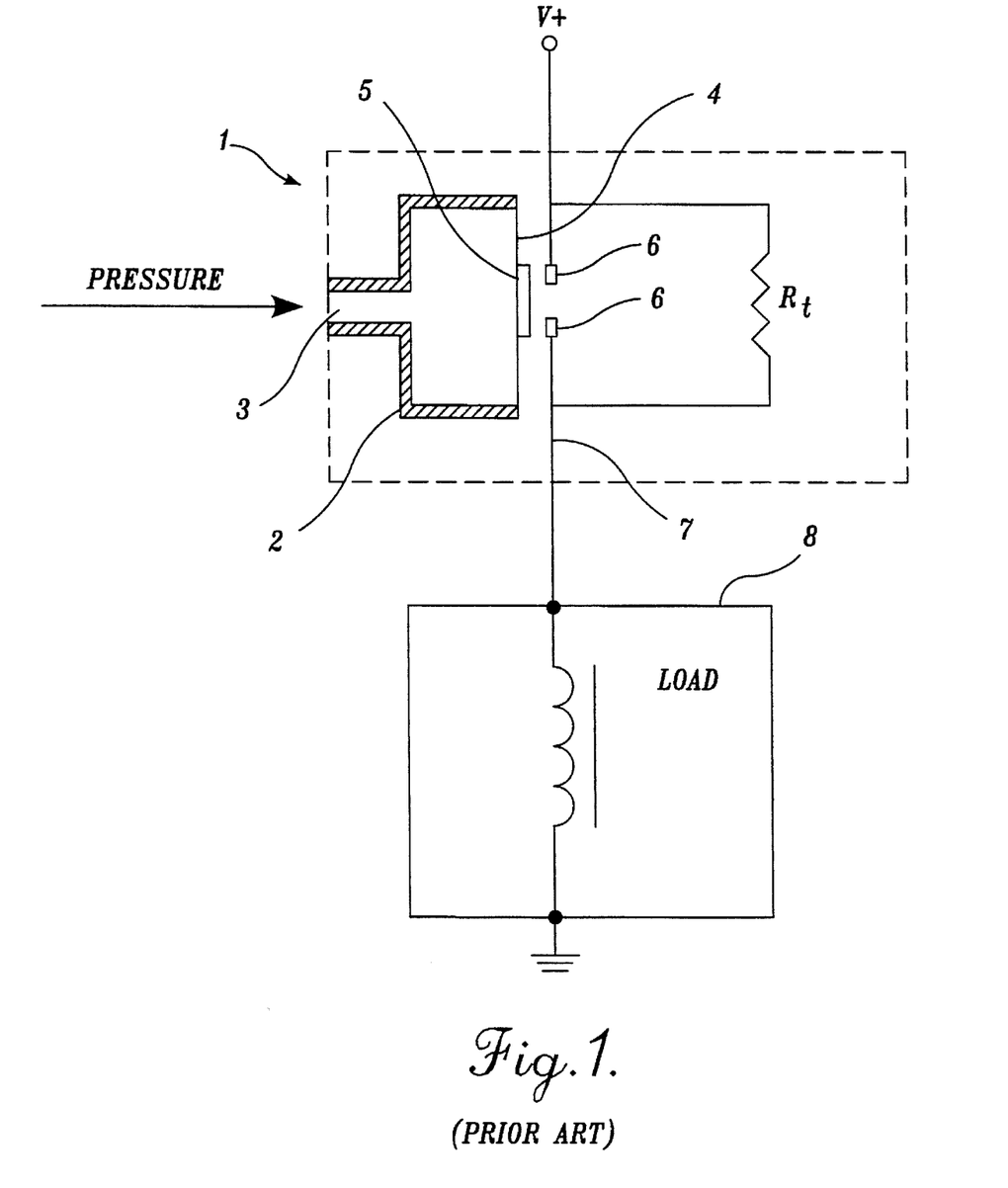
FIG. 1 is a diagrammatic illustration of a conventional mechanical pressure responsive switch.

FIG. 1 illustrates diagrammatically a conventional mechanical switch automatically responsive to an environmental condition to which the switch is subjected, namely, pressure. The conventional switch 1 can include a housing 2 having an orifice 3 such that the interior of the housing is exposed to surrounding atmosphere. Housing 2 supports a movable diaphragm 4 having a central electrically conductive contact 5. For pressure exceeding a predetermined pressure, the diaphragm moves to engage its contact 5 against conductive terminals 6 in the line 7 between a voltage source (V+) and a load 8. In addition, known mechanical pressure switches may be provided with a resistor $R_t$ connected across the contacts 6 so that a conventional line integrity check can be made even when the switch is open. For example, such an integrity check may be desirable to confirm that the load has not been short-circuited, which could not be determined upstream from the switch with the switch open unless there is some parallel current path across the contacts 6.

Figure 2:
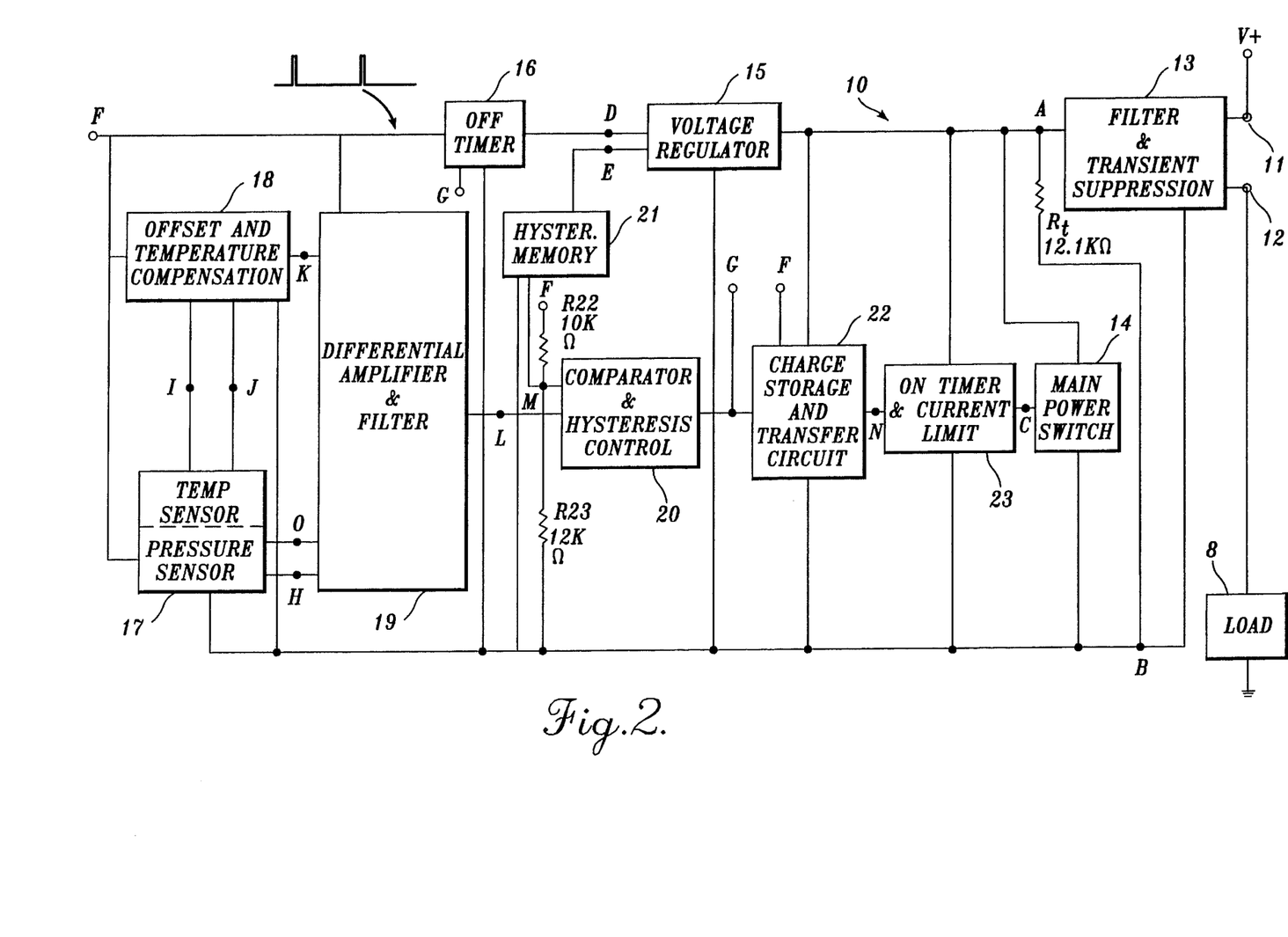
FIG. 2 is a block diagram of a condition responsive solid state-switch in accordance with the present invention.
Figure 3:
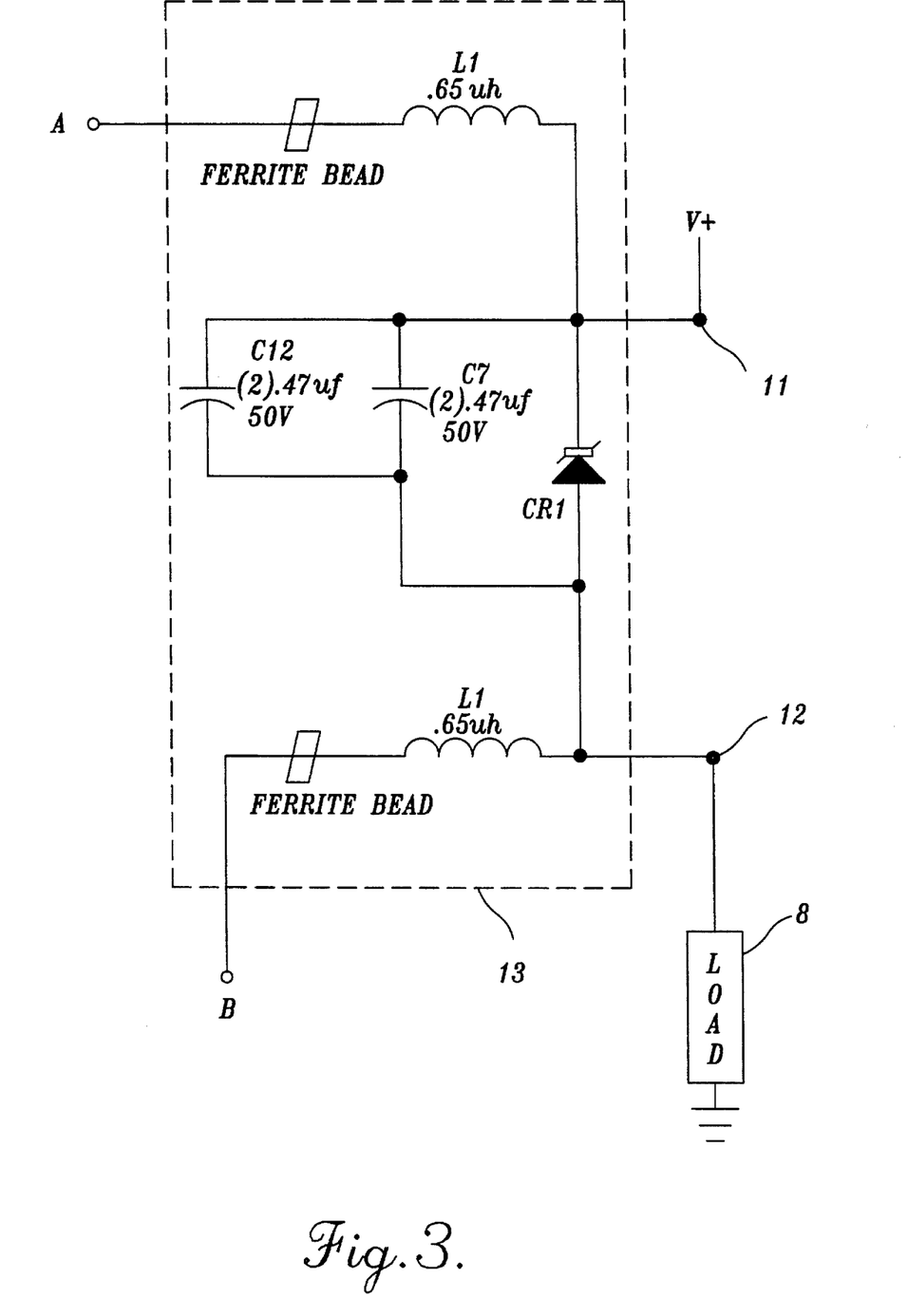
FIG. 3 is a detailed circuit diagram of one component of the circuit of FIG. 2, namely, the filter and transient suppression circuit.

With reference to FIG. 2, the switch circuit 10 in accordance with the present invention provides the advantages of solid-state operation, which include advanced temperature compensation, hysteresis, current limit, reliability and long life, without requiring an independent power source or line, and without significantly affecting voltage supplied to the load. Rather, switch circuit 10 is simply connected between line terminals 11 and 12 between the voltage source (V+) and the load 8. Consequently, switch 10 can be substituted for known mechanical switches in existing designs, and even be retrofitted into existing installations. The particular application for the preferred embodiment in accordance with the present invention is in an aircraft turbine engine environment. To illustrate the complexity of the specifications that must be met, the preferred embodiment described below meets the following design criteria:

Trigger point: at falling pressure, switch to close at 70 PSIA ± 3 PSIA;

Hysteresis: switch to open at 7.5 PSIA above the actual switch point, ±2.5 PSIA;

Temperature: switch to operate reliably through a temperature range of −65° F. to positive 300° F.;

Power requirement: switch to operate for standard airframe power, varying from 16 volts DC to 32 volts DC (as compared to nominal air frame power of 28 volts DC);

Load: switch effective to drive a load (solenoid valve) of about 240 millihenries and 40 ohms, maximum current 1 amp.

In general, the representative and preferred embodiment circuit of the switch in accordance with the present invention is shown in block diagram form in FIG. 2, and the detailed circuit diagrams are shown in FIGS. 3–8 and 10–14. Reference letters A through O indicate the points of interconnection of the different circuit components. Beginning at the line terminals 11 and 12 between the power source (V+, e.g., standard airflame power) and load 8, the initial component is a filter and transient suppression circuit 13, shown in detail in FIG. 3, which filters the airframe 28 volt DC power (variable from 16 volts to 32 volts) through a network of inductors, capacitors, and ferrite beads. These filter components help assure compliance with electromagnetic interference specifications. Input voltage transients are suppressed though a fast-action zener diode CR1 connected across the input.

Figure 4:
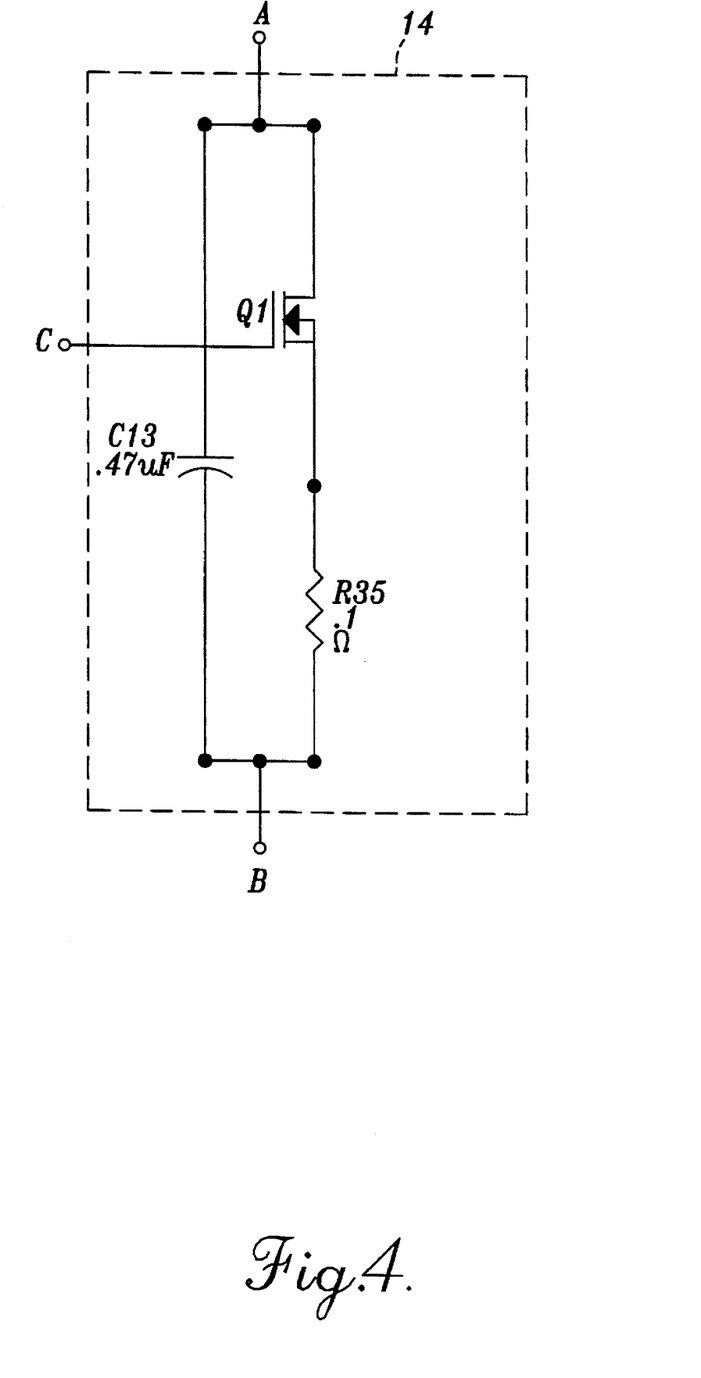
FIG. 4 is a detailed circuit diagram of another component of the circuit of FIG. 2, namely, the main power switch.

Returning to FIG. 2, the heart of the circuit in accordance with the present invention is the main power switch 14, for which the detailed circuit is shown in FIG. 4. Such switch consists of a power MOSFET Q1 which, based on a charging or discharging signal supplied at connection C, is maintained in its on (closed) state or its off (open) state. Capacitor C13 dampens the flyback or ringing from an inductive load whenever Q1 opens. R35 helps limit peak current through Q1 by providing a voltage drop that subtracts from the gate drive voltage. With Q1 "off" (main power switch opened), there would be an essentially open circuit between switch terminals 11 and 12 shown in FIG. 2, except for resistor $R_t$ which functions to provide a trickle current for standard line integrity checks. In addition, in this condition there is substantial voltage potential between points A and B usable to power the remainder of the circuit.

Figure 5:
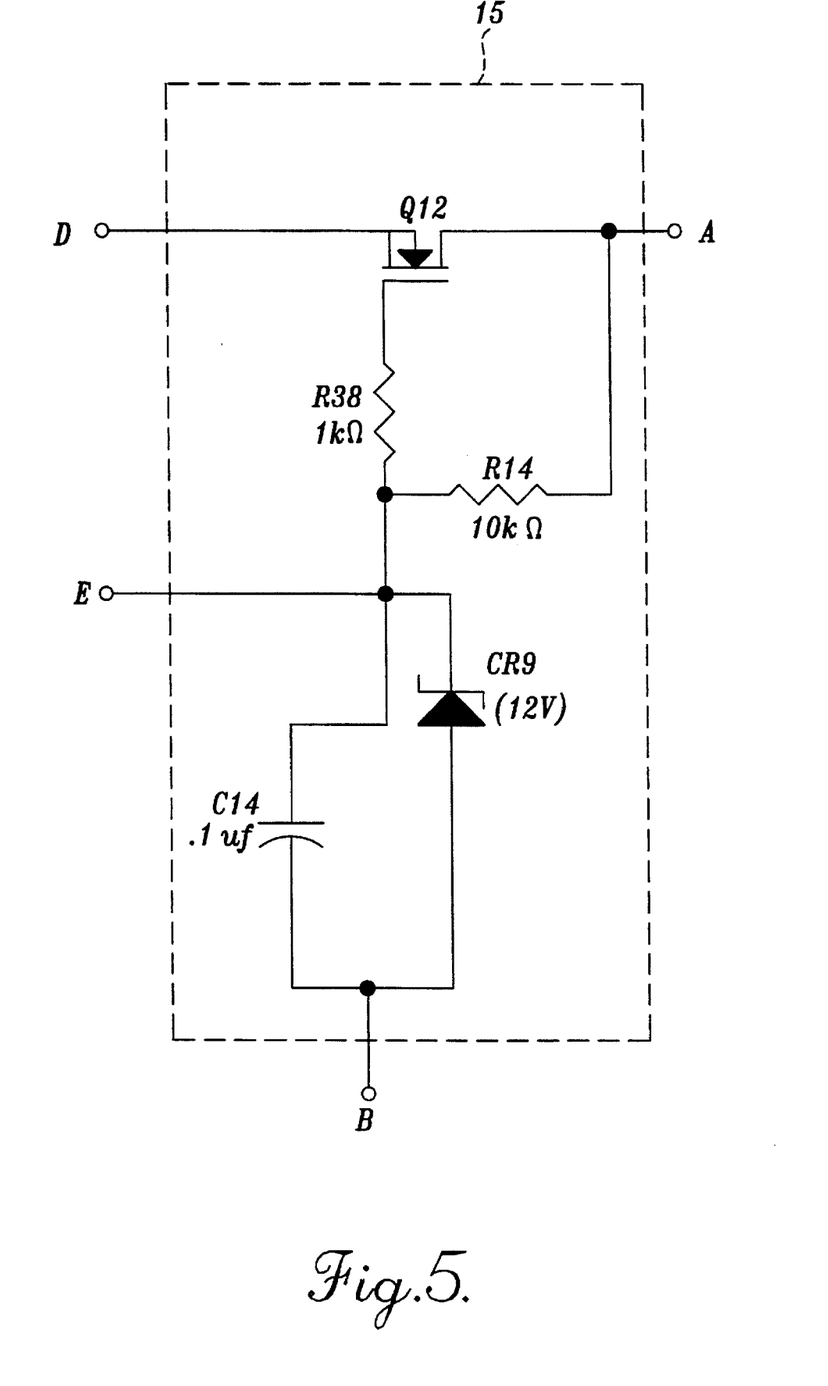
FIG. 5 is a detailed circuit diagram of another component of the circuit of FIG. 2, namely, the voltage regulator.

Continuing with the main power switch 14 in its open or off condition, the next circuit component is a voltage regulator 15 for which the detailed circuit diagram is shown in FIG. 5. Unregulated air frame provided DC power is regulated by a zener diode CR9 and buffered by a source follower to provide an output of about 10 volts DC at output D. The regulated DC voltage output at point E is about 12 volts.

Figure 6:
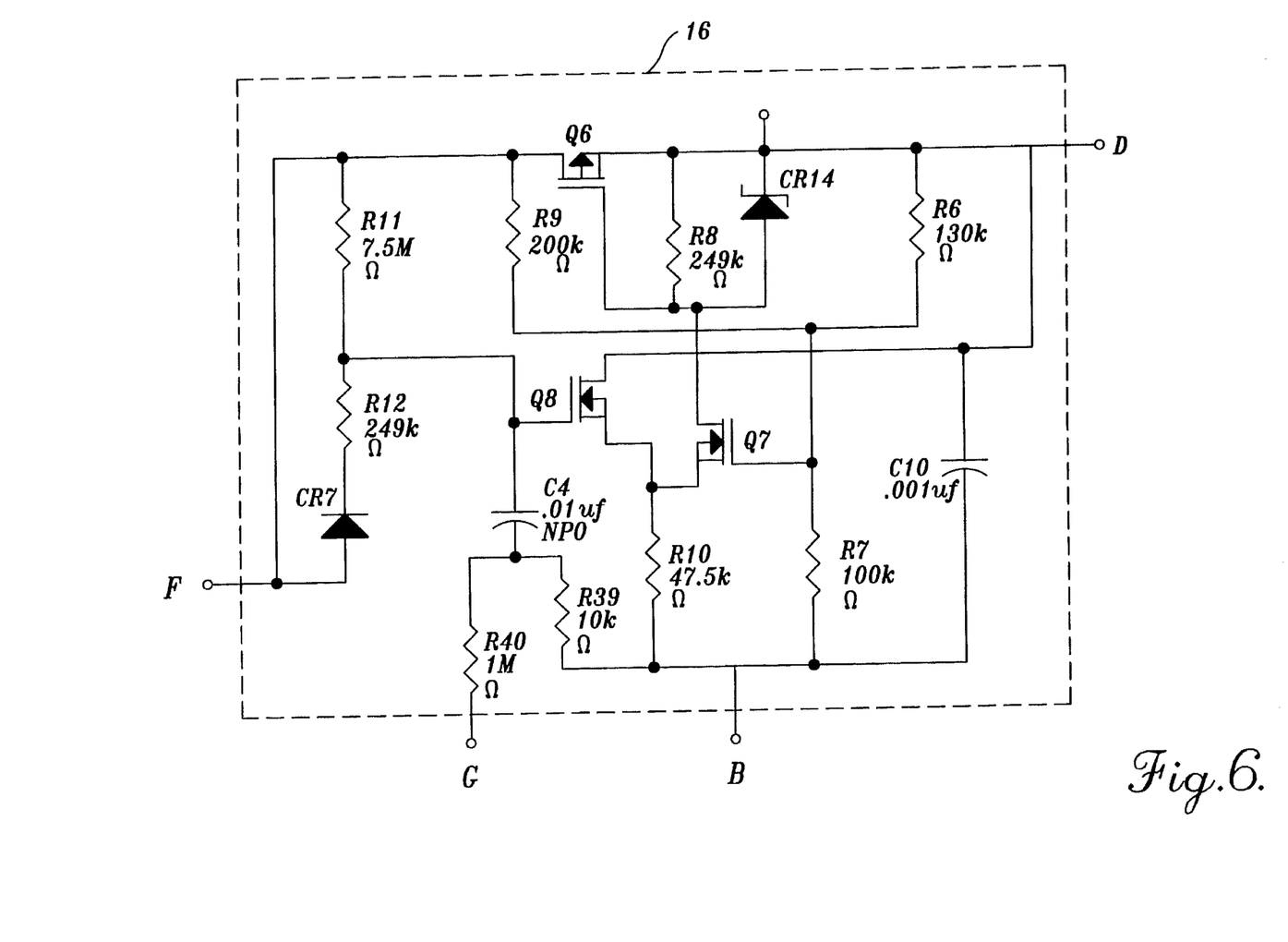
FIG. 6 is a detailed circuit diagram of another component of the circuit of FIG. 2, namely, the off timer circuit.

As seen in FIG. 2, the 10-volt DC output (D) of the voltage regulator is supplied to a timer circuit 16, referred to as the "off timer" because it operates when the main power switch 14 is off or opened. As seen in FIG. 6, the off timer 16 is an astable multivibrator providing output voltage pulses that power several circuit components, described in more detail below. In the preferred embodiment, the output pulses supplied at point F have a duration of about 1 millisecond, with a period of about 32 milliseconds between consecutive pulses, and a pulse height of about 10 volts. Consequently, the off timer substantially reduces average current drain for the condition when the main power switch is off.

Figure 7:
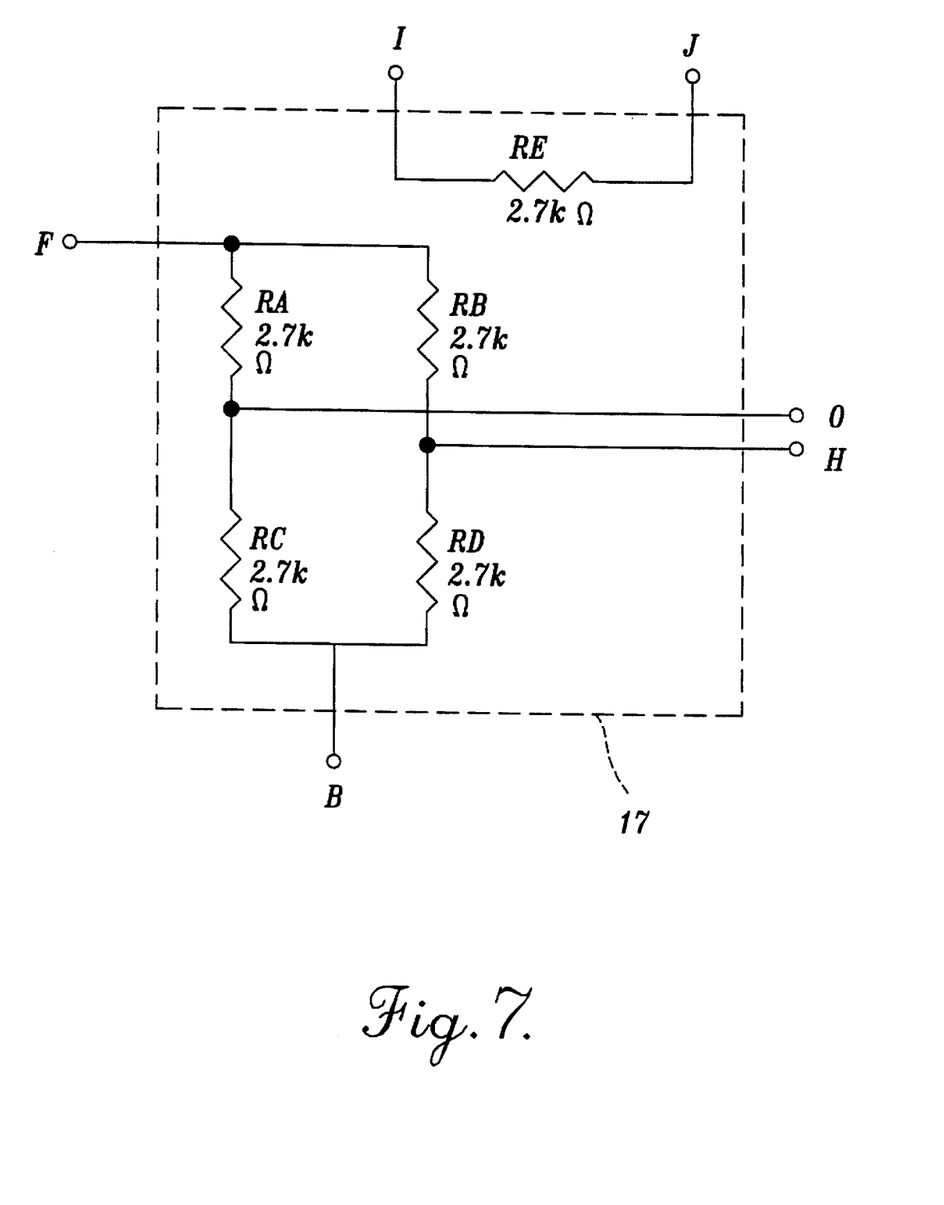
FIG. 7 is a detailed circuit diagram of another component of the circuit of FIG. 2, namely, the temperature sensor and pressure sensor circuit.

Output pulses from the off timer are supplied to a combined temperature sensing and pressure sensing circuit 17 shown in FIG. 7. For pressure sensing, silicon piezoresistive strain sensing resistors RA, RB, RC and RD are arranged in a bridge configuration on a pressure sensing diaphragm. The bridge differential output voltage across points O and H varies in proportion to pressure when excited with a constant voltage source, such as a 1 millisecond 10-volt pulse from the off timer (point F). The temperature sensing resistor RE varies proportional to temperature. The preferred pressure sensing and temperature sensing circuit is a silicon on sapphire bridge pressure sensor with an integral temperature sensing resistor.

Figure 8:
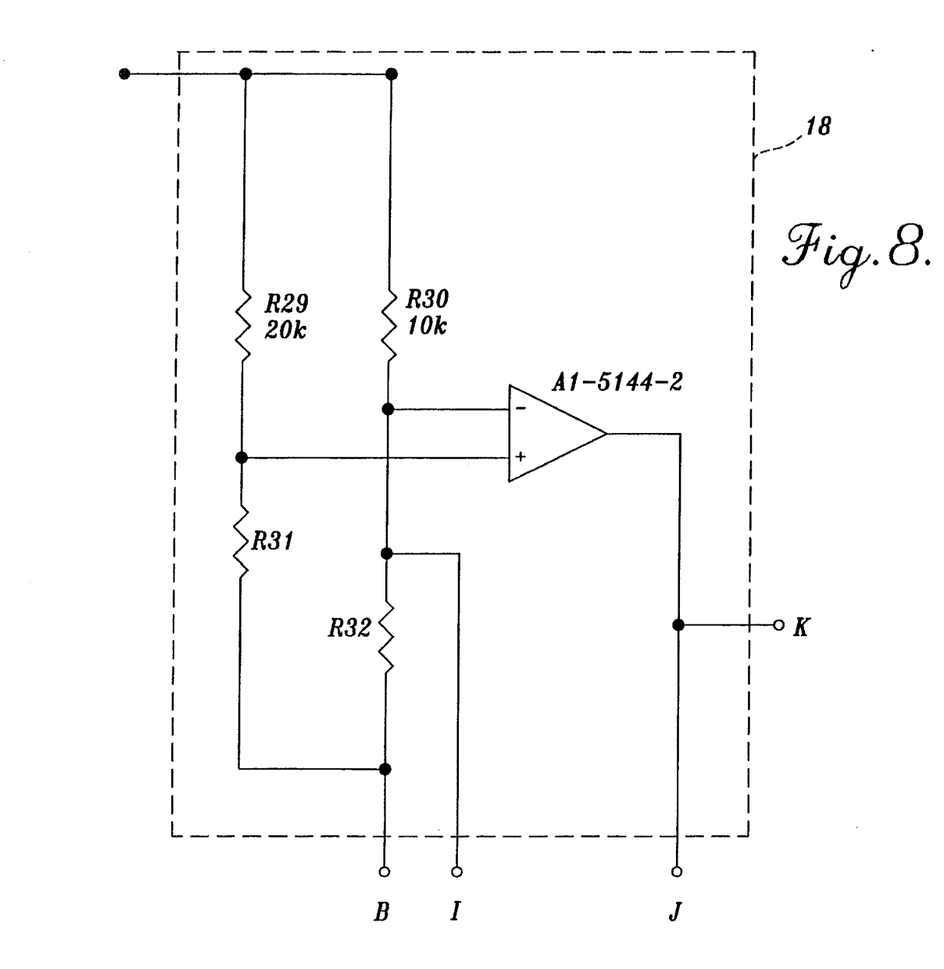
FIG. 8 is a detailed circuit diagram of another component of the circuit of FIG. 2, namely, the offset and temperature compensation circuit.
Figure 9:
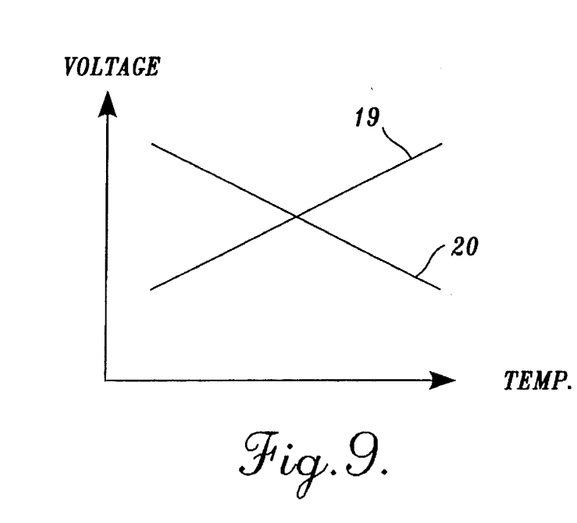
FIG. 9 is graph illustrating operation of a component of the circuit in accordance with the present invention, namely, temperature compensation.

The pulse output of the off timer also is supplied to an offset and temperature compensation circuit 18, shown in detail in FIG. 8. Solid-state pressure sensors provide a consistent voltage output, but are not perfect in providing outputs identical for different sensors. Each individual pressure sensor voltage output varies as a function of temperature. In addition, zero pressure does not necessarily result in zero output volts. In the temperature compensation and offset circuit, a pair of voltage dividers is set up such that the difference between them compensates for the pressure sensor offset. Further, the divider resistances are calculated such that, in combination with the integral temperature sensor changing resistance, the compensation offset voltage varies appropriately with temperature to compensate for the pressure sensor voltage output that changes as a function of temperature. Values for resistors R31 and R32 must be selected judiciously after testing the pressure-temperature sensor to determine its individual characteristics. In a representative embodiment, R31 may be 6.8K ohms and R32 may be 2.2K ohms. The desired relationship of varying pressure voltage output and the output of the temperature compensation circuit is illustrated in FIG. 9. Line 19 represents pressure signal variation as a function of temperature, whereas line 20 represents the voltage output (point K) of the offset and temperature compensation circuit 18. Preferably, the two lines have slopes of equal but opposite magnitudes such that, downstream, variation of the voltage of the pressure signal as a function of temperature is compensated for by the signal from the offset and temperature compensation circuit 18.

Figure 10:
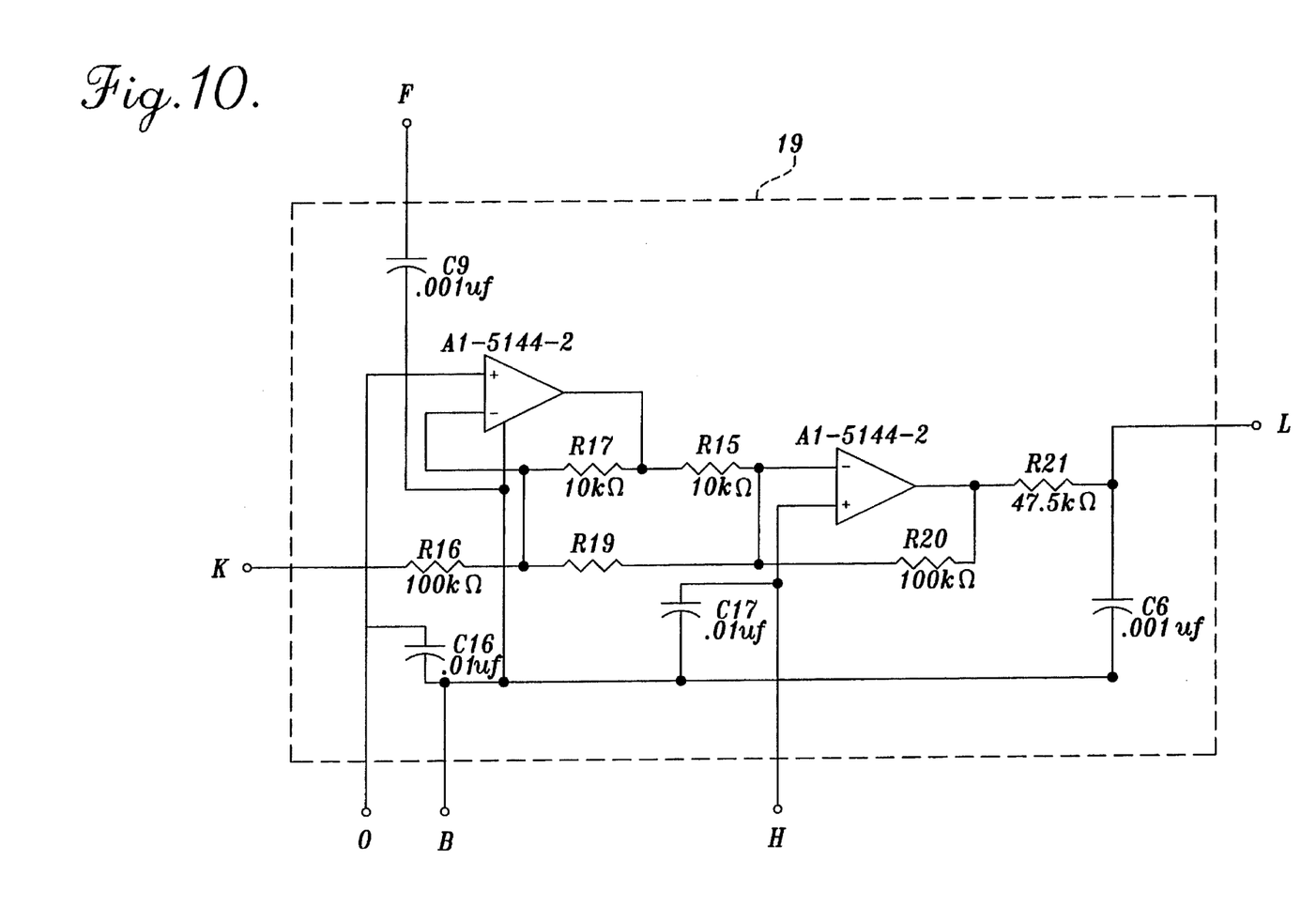
FIG. 10 is a detailed circuit diagram of another component of the circuit of FIG. 2, namely, the differential amplifier and filter circuit.

The voltage pulses from the off timer (F) also are used to power the differential amplifier circuit 19 shown in detail in FIG. 10. The voltage gain is adjusted by selection of resistor R19, based on the characteristics of the individual sensor used. In a representative embodiment, the value of R19 can be 6.9K ohms. The amplifier circuit includes a low pass filter, R21 and C6, to reduce transients caused by the pulsed power application.

Returning to FIG. 2, the output from the amplifier and filter circuit 19 (point L) is proportional to pressure and reliable for the desired temperature range. Such output serves as one input to a comparator and hysteresis control circuit 20. The other input, point M, is a reference voltage derived by applying the off timer pulse output (F) across a voltage divider consisting of resistor R22 and resistor R23.

Figure 11:
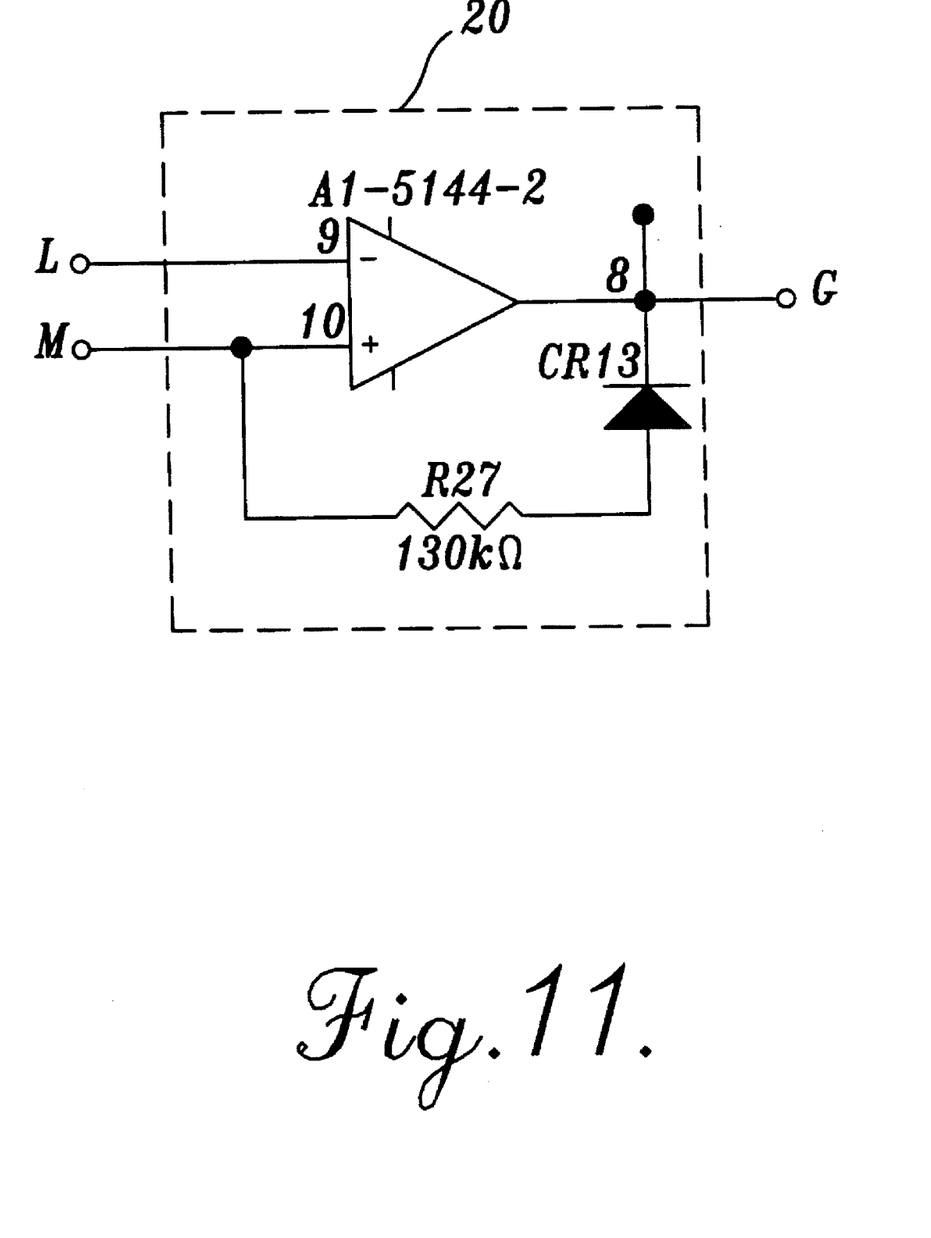
FIG. 11 is a detailed circuit diagram of another component of the circuit of FIG. 2, namely, the comparator and hysteresis control circuit.
Figure 12:
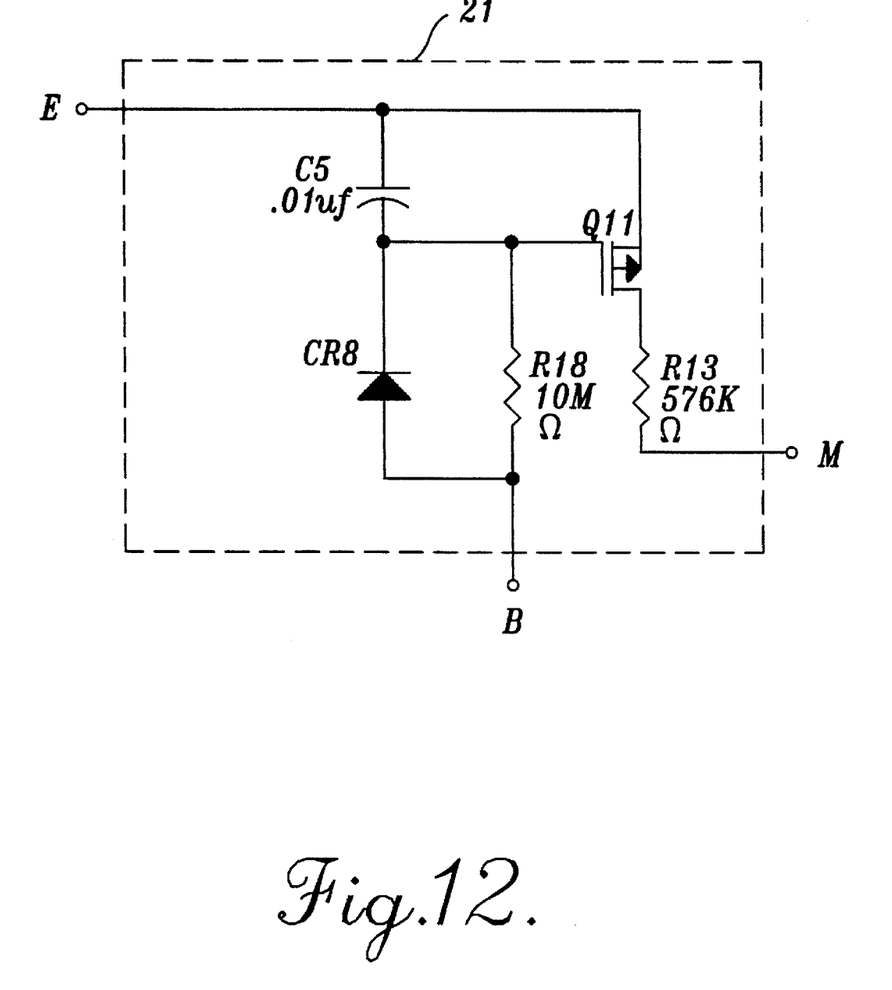
FIG. 12 is a detailed circuit diagram of another component of the circuit of FIG. 2, namely, the hysteresis memory circuit.
Figure 13:
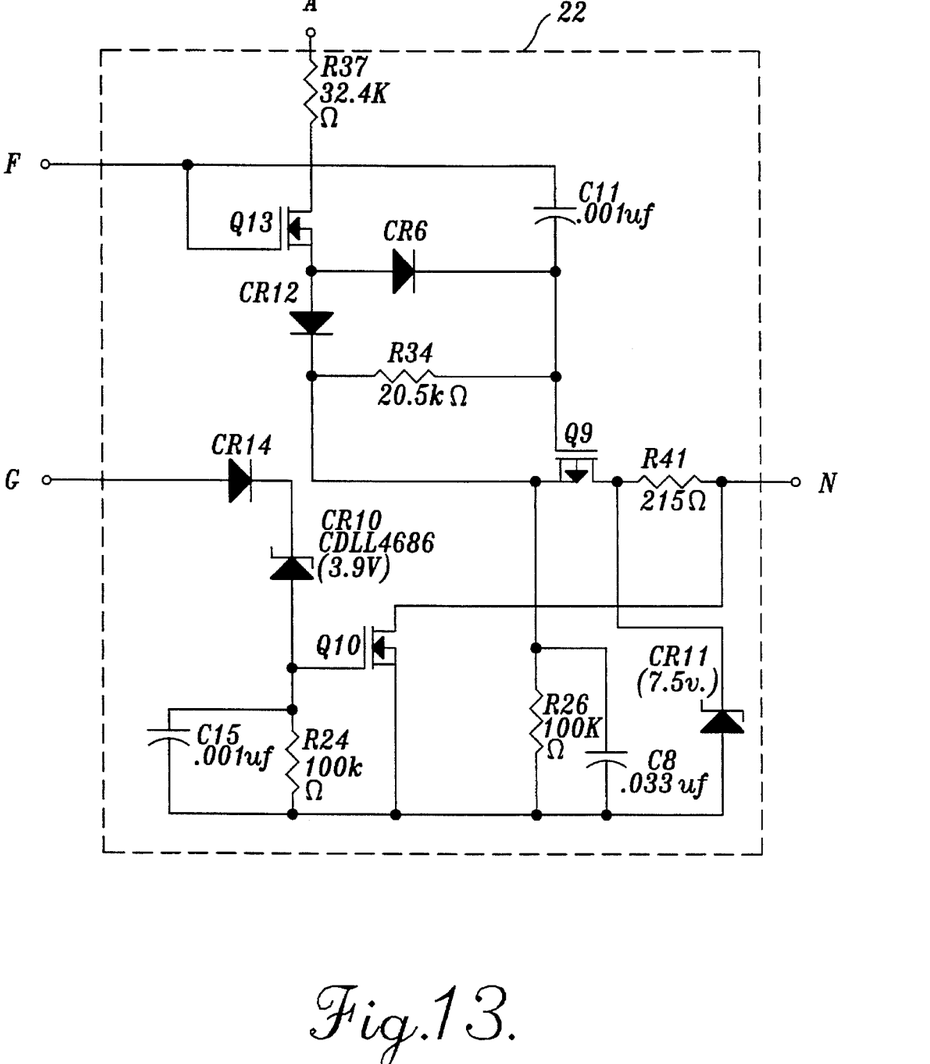
FIG. 13 is a detailed circuit diagram of another component of the circuit of FIG. 2, namely, the charge storage and transfer circuit.

The detailed circuit of the comparator 20 is shown in FIG. 11. The comparator supplies an output (point G) if the pressure signal (L) exceeds the reference voltage (M), with the desired hysteresis by virtue of the feedback loop consisting of R27 and CR13. However, the switch point is adjusted based on whether the main power switch was turned on or off during the last cycle, i.e., during the evaluation or monitoring period of the previous pulse supplied by the off timer. This adjustment is accomplished by the hysteresis memory circuit 21 shown in FIG. 12. Power to the hysteresis memory circuit comes directly from the voltage regulator's zener diode (point E) to minimize interaction with other circuit components. Depending on whether the switch previously was on, the effect of the hysteresis memory circuit is to adjust the reference voltage at point M). Recall, for example, that the design criteria requires initial switchover at decreasing pressure of 70 PSIA (±3 PSIA) with hysteresis of 7.5 PSIA from the actual switch point (±3 PSIA). If the power switch is open, regulated power at point E charges capacitor C5 sufficiently to turn on transistor Q11 which adjusts the reference voltage at point M. If the power switch is closed, there is insufficient voltage to operate the voltage regulator and transistor Q11 remains off. As described in more detail below, the closed power switch is opened for short periods during circuit operation, but the duration is not long enough to charge C5 sufficiently to actuate transistor Q11. Consequently, Q11 is turned on only when the power switch is off, which has the effect of adjusting the reference voltage at point M.

Ultimately, a signal from the comparator circuit 20 (G) is conveyed to a charge storage and transfer circuit 22 for triggering the main power switch to close. Circuit 22 is shown in detail in FIG. 13. Power to such circuit also is supplied by the output pulse (F) of the off timer. At startup, a capacitor, C8, is charged. When the sensed pressure is above the established threshold level (appropriate hysteresis being considered), the signal from comparator (G) will, at the falling edge of the power pulse (F), result in transferring the charge from capacitor C8 to the output line N. The charge storage and transfer circuit is tuned such that the amount of charge is sufficient to turn the main power switch on for expected load currents, but will desaturate readily for overload conditions. This is accomplished by selection of the values for R26 and C8. More specifically, a high voltage signal at G results in turning transistor Q10 on which results in essentially a short circuit between N and B. In this condition, the charge stored in capacitor C8 is not transferred. A low voltage signal at G results in Q10 remaining off. In this condition, the gate of transistor Q9 is driven at the falling edge of a power pulse (F) from the off timer, such that charge stored in capacitor C8 is transferred to point N through Q9 and R41. In general, R37, Q13 and CR12 are in the precharge path for capacitor C8, whereas CR6, R34 and C11 cooperate to drive Q9 at the falling edge of a power pulse.

Figure 14:
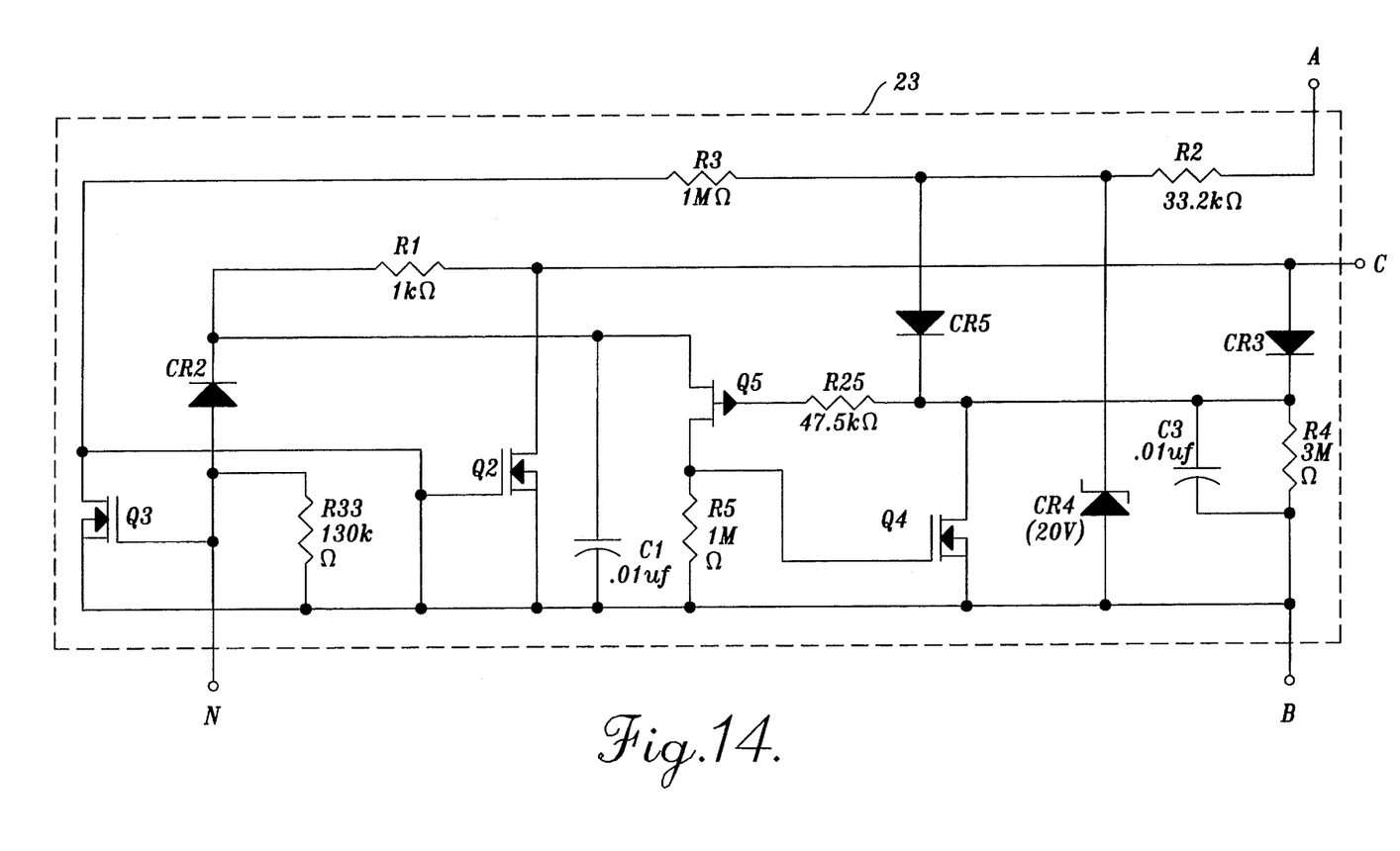
FIG. 14 is a detailed circuit diagram of another component of the circuit of FIG. 2, namely, the on timer and current limit circuit.

Charge transfer is conveyed through the on timer and current limit circuit 23, shown in detail in FIG. 14. The path from line N is through diode CR2 and resistor R1 to the trigger input C of the main power switch. The result is that the main power MOSFET Q1 (FIG. 4) is turned on and will remain in the on state until turned off.

It should be kept in mind that the entire power-up, pressure sensing, and switch controlling process occurs during a single pulse from the off timer, i.e., in approximately 1 millisecond in the preferred embodiment. Also, during this time power to the off timer, required for the remainder of the circuit operation, was obtained by virtue of the fact that the main power switch was off such that the voltage from the power source (V+) was applied across the switch. Once the switch has been turned on, power no longer is available for circuit operation. Consequently, the on timer 23 periodically drains the charge from the trigger input (C) of the main power switch, such as once every 32 milliseconds. In the off state of the main power switch, the timing capacitor C3 is charged. In the off state of the main power switch, capacitor C3 discharges "gradually," i.e., in about 32 milliseconds, which results in turning on transistors Q4 and Q5. Charge at C is immediately drained through CR3 and Q4, which momentarily opens the power switch to power up the voltage regulator, off timer, etc., for the periodic monitoring of the sensed condition. The off timer substantially immediately supplies the 1 millisecond 10-volt pulse for powering up the circuit components to evaluate the pressure and, if appropriate, substantially immediately transfer charge back to the trigger input of the main power switch to maintain it in its on or closed state.

The circuit of FIG. 14 also has the effect of limiting maximum current applied across the main power switch. Desaturation of the main power switch Q1, in combination with increasing voltage across its series resistor R35, both caused by excess current, will have the effect of turning on transistor Q2 which quickly drains the charge from the gate (C) of the power switch, thereby turning off the power switch for excess current conditions.

Thus, the solid-state switch in accordance with the present invention periodically monitors the sensed condition and controls the flow of current from a source to a load, without requiring a separate power source for circuit operation and with minimal effect on the voltage available for the load. Consequently, the solidstate switch can replace a mechanical switch without extensive redesign of the system or circuit in which the switch is used.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A switch for automatically controlling the supply of power from a voltage source to a load based on an environmental condition to which the switch is subjected comprising:

a solid-state switching component for coupling between the voltage source and the load to supply an interruptible current path therebetween and having a trigger input for actuation of the switching component so as to selectively control the switching component between an on (closed) state and an off (open) state;

an off timer circuit for coupling between the voltage source and the load to receive power therefrom when the switching component is in its off state and for periodically generating power pulses of short duration with the period between consecutive power pulses being much greater than the duration of each power pulse, the off timer circuit having an output at which the power pulses generated thereby are supplied;

a sensing circuit connected to the output of the off timer circuit and powered by the power pulses, the sensing circuit including a sensor for sensing the environmental condition during each power pulse, a first signal generator connected to the sensor for generating a first signal varying based on the sensed condition, a reference signal generator for generating a reference signal during each power pulse, and a comparator coupled to the first signal generator and the reference signal generator for comparing the first signal with the reference signal and for generating a trigger signal for each power pulse when a predetermined relationship exists between the reference signal and the first signal;

means coupled between the comparator and the trigger input of the switching component for conveying the trigger signal to the trigger input of the switching component such that the switching component is actuated to its on and off states as a function of changes in the sensed condition;

an on-timer circuit for coupling between the voltage source and the load to receive power therefrom when the switching component is in its on state and for periodically momentarily supplying an interrupt signal; and means coupled between the on-timer circuit and the trigger input of the switching component for connecting the on timer circuit to the trigger input of the switching component, and for actuating the switching component to its off state if the switching component was previously in its on state to power the off timer to again supply the power pulses, whereby the environmental condition continues to be sensed periodically and the trigger signal continues to be generated periodically based on the sensed condition.

2. The switch defined in claim 1, in which the sensing circuit includes a memory circuit for adjusting the reference signal based on whether the switching component was in its on or off state during the preceding power pulse.

3. The switch defined in claim 1, in which the switching component includes a power MOSFET, actuated to its on state by supplying charge to the gate, the power MOSFET normally being in its on state following supply of charge to its gate, and the trigger signal being effective to drain charge from the gate of the power MOSFET for actuating the MOSFET to its off state as a function of change in the sensed condition.

4. The switch defined in claim 1, in which the sensed condition is pressure.

5. The switch defined in claim 1, in which the sensed condition is pressure, the sensing circuit including a pressure sensor providing, during each power pulse, a signal which is a function of the ambient temperature, the sensing circuit further including a temperature compensation circuit for adjusting the first signal for substantially uniform operation based on varying pressure for a wide temperature range.

6. The switch defined in claim 1, in which power to the switching component, off timer circuit, sensing circuit, and on timer circuit are obtained solely by two-wire interconnection between the source and the load.

7. A switch for automatically controlling the supply of power from a voltage source to a load based on an environmental condition to which the switch is subjected, comprising:

a solid-state switching component for coupling between the voltage source and the load to supply an interruptible current path therebetween and having a trigger input for actuation of the switching component so as to selectively control the switching component between an on (closed) state and an off (open) state;

an off timer circuit for coupling between the voltage source and the load to receive power therefrom when the switching component is in its off state and for periodically generating power pulses of short duration with the period between consecutive power pulses being much greater than the duration of each power pulse, the off timer circuit having an output at which the power pulses generated thereby are supplied;

a sensing circuit connected to the output of the off timer circuit and powered by the power pulses for sensing the environmental condition during each power pulse and for generating a trigger signal for each power pulse based on the condition sensed;

means coupled between the sensing circuit and the trigger input of the switching component for conveying the trigger signal to the trigger input of the switching component such that the switching component is actuated to its on and off states as a function of changes in the sensed condition;

an on timer circuit for coupling between the voltage source and the load to receive power therefrom when the switching component is in its on state and for periodically momentarily supplying an interrupt signal; and means coupled between the on timer circuit and the trigger input of the switching component for connecting the on timer circuit to the trigger input of the switching component, and for actuating the switching component to its off state if the switching component was previously in its on state to power the off timer to again supply the power pulses, whereby the environmental condition continues to be sensed periodically and the trigger signal continues to be generated periodically based on the sensed condition, and wherein power to the switching component, off timer circuit, sensing circuit, and on time circuit are obtained solely by two-wire interconnection between the source and the load.

* * * * *